United States Patent
Takegahara

[19]
[11] Patent Number: 5,943,345
[45] Date of Patent: Aug. 24, 1999

[54] AM MULTIPLEXING BROADCAST APPARATUS

[75] Inventor: Toshiyuki Takegahara, Tokyo, Japan

[73] Assignee: Kabushiki Kaisha Kenwood, Kangawa-ken, Japan

[21] Appl. No.: 08/949,695

[22] Filed: Oct. 14, 1997

[30] Foreign Application Priority Data

Jan. 30, 1997 [JP] Japan ................................. 9-029810

[51] Int. Cl.$^6$ ....................................................... H04J 1/00
[52] U.S. Cl. .......................... 370/480; 370/214; 370/343; 455/102; 455/105
[58] Field of Search .................................... 370/211, 214, 370/480, 485, 486, 487, 343; 455/91, 102, 105, 108, 109, 130, 131

[56] References Cited

U.S. PATENT DOCUMENTS 4,867,859  9/1989  Asahi et al. ........................... 329/104

*Primary Examiner*—Jeffery A. Hofsass
*Assistant Examiner*—Clement Townsend
*Attorney, Agent, or Firm*—Sixbey, Friedman, Leedom & Ferguson, P.C.; Eric J. Robinson

[57] ABSTRACT

An AM multiplexing broadcast apparatus multiplexes a digital modulated signal independent of an AM modulated signal, in the same frequency band as the AM modulated signal. A sum signal is amplified by a first amplifier. An inverse of the sum signal is obtained by an inverse calculator. A divider divides this inverse signal by a magnification factor of the first amplifier. An output of the divider and a digital modulated signal in the same frequency band as an AM modulated signal are multiplied by a first multiplier. A carrier generated by a carrier generator is phase-modulated by a phase modulator. Outputs of the phase modulator and first multiplier are synthesized and thereafter amplified by a second amplifier. Outputs of the first and second amplifiers are multiplied by a second multiplier and transmitted from an antenna.

3 Claims, 1 Drawing Sheet

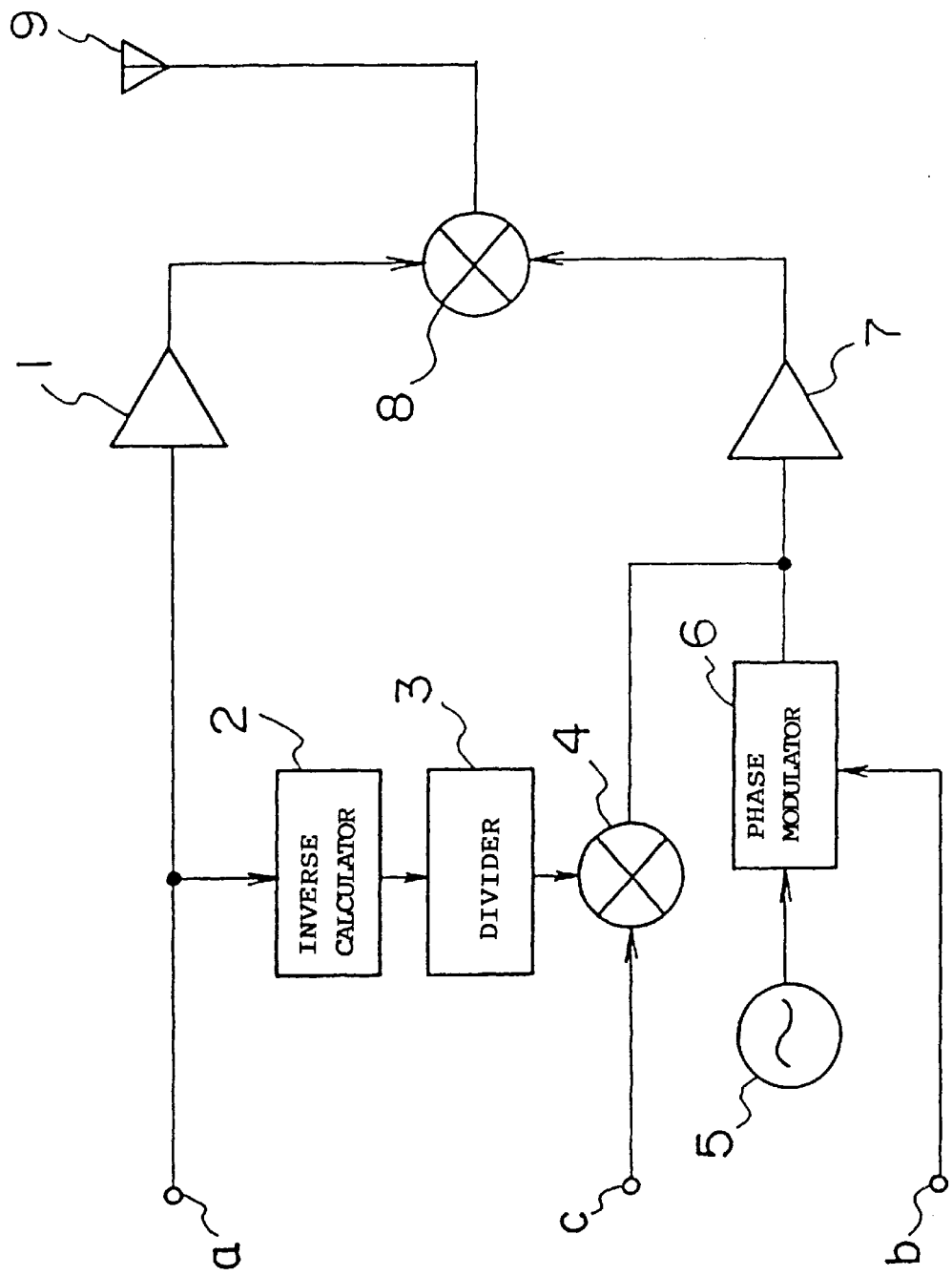

AM MULTIPLEXING BROADCAST APPARATUS

BACKGROUND OF THE INVENTION

1. Field of the Invention

The present invention relates to an AM multiplexing broadcast apparatus for multiplexing a digital modulated signal independent of an AM modulated signal, in the same frequency band as the AM modulated signal.

2. Description of the Related Art

Such an AM multiplexing broadcast apparatus for multiplexing a digital modulated signal independent of an AM modulated signal, in the same frequency band as the AM modulated signal, is still not known. Conventionally, for such multiplication, both an AM transmitter and a digital transmitter are prepared and radio waves transmitted from respective antennas are synthesized in the air.

A single antenna shared by both an AM transmitter and a digital transmitter may be used for addition of radio waves of small power transmitters. However, it is very difficult to apply this method to transmitters of several kW to several hundreds kW.

In multiplexing a digital modulated signal independent from an AM modulated signal, in the same frequency band as the AM modulated signal, two antennas for an AM transmitter and a digital transmitter are required as in the above conventional case. This results in a bulky system of apparatuses.

SUMMARY OF THE INVENTION

It is an object of the present invention to provide an AM multiplexing broadcast apparatus for multiplexing a digital modulated signal independent of an AM modulated signal, in the same frequency band as the AM modulated signal.

According to one aspect of the present invention, there is provided an AM multiplexing broadcast apparatus for multiplexing a digital modulated signal independent of an AM modulated signal, in the same frequency band as the AM modulated signal, which comprises: an inverse calculator for calculating an inverse of a modulation signal; a first multiplier for multiplying a signal associated with an output of the inverse calculator by the digital modulated signal in the same frequency band as the AM modulated signal; and a second multiplier for multiplying a signal obtained by synthesizing an output of the first multiplier with an output of a carrier generator by a signal associated with the modulation signal, wherein an output of the second multiplier is transmitted.

In this AM multiplexing broadcast apparatus, the first multiplier multiplies an inverse of the modulation signal by the digital modulated signal, so that the inverse of the modulation signal is AM modulated by the digital modulated signal. The second multiplier multiplies the synthesized signal of an output of the first multiplier and an output of the carrier generator by a signal associated with the modulation signal, so that the synthesized signal is AM modulated by the modulation signal. Accordingly, the digital modulated signal AM modulated by the first multiplier is demodulated by the second multiplier to recover the original digital modulated signal. This digital modulated signal is multiplexed at the second multiplier on a signal obtained by AM modulating an output of the carrier generator with the modulation signal.

According to another aspect of the invention, there is provided an AM multiplexing broadcast apparatus for multiplexing a digital modulated signal independent of an AM modulated signal, in the same frequency band as the AM modulated signal, which comprises: an amplifier for amplifying a modulation signal; an inverse calculator for calculating an inverse of the modulation signal; a divider for dividing an output of the inverse calculator by an amplification factor of the amplifier; a first multiplier for multiplying an output of the divider by the digital modulated signal in the same frequency band as the AM modulated signal; and a second multiplier for multiplying a signal obtained by synthesizing an output of the first multiplier with an output of a carrier generator by an output of the amplifier, wherein an output of the second multiplier is transmitted.

In this AM multiplexing broadcast apparatus, the divider outputs a product of the inverse of the modulation signal and an inverse of the amplification factor of the amplifier. The first multiplier multiplies an output of the divider by the digital modulated signal, so that the output of the divider is AM modulated by the digital modulated signal. The second multiplier multiplies the synthesized signal of an output of the first multiplier and an output of the carrier generator by the modulation signal amplified by the amplifier, so that the synthesized signal is AM modulated by the modulation signal. Accordingly, the digital modulated signal AM modulated by the first multiplier is demodulated by the second multiplier to recover the original digital modulated signal, and the synthesized signal is AM modulated at the second multiplier by the modulation signal amplified by the amplifier. This AM modulated signal and the demodulated digital modulated signal are multiplexed and transmitted.

According to a further aspect of this invention, there is provided an AM multiplexing broadcast apparatus for multiplexing a digital modulated signal independent of an AM modulated signal, in the same frequency band as the AM modulated signal, which comprises: a first amplifier for amplifying a modulation signal; an inverse calculator for calculating an inverse of the modulation signal; a divider for dividing an output of the inverse calculator by an amplification factor of the first amplifier; a first multiplier for multiplying an output of said divider by the digital modulated signal in the same frequency band as the AM modulated signal; and a second amplifier for amplifying a signal obtained by synthesizing an output of the first multiplier with an output of a carrier generator; and a second multiplier for multiplying an output of the first amplifier by an output of the second amplifier, wherein an output of the second multiplier is transmitted.

In this AM multiplexing broadcast apparatus, the divider outputs a product of the inverse of the modulation signal and an inverse of the amplification factor of the first amplifier. The first multiplier multiplies an output of the divider by the digital modulated signal, so that the output of the divider is AM modulated by the digital modulated signal. The synthesized signal of the output of the first multiplier and the output of the carrier generator is amplified by the second amplifier. The second multiplier multiplies the modulation signal amplified by the first amplifier by an output of the second amplifier, so that the synthesized signal amplified by the second amplifier is AM modulated by the modulation signal. Accordingly, the digital modulated signal AM modulated by the first multiplier is demodulated by the second multiplier to recover the original digital modulated signal, and the synthesized signal amplified by the second amplifier is AM modulated at the second multiplier by the modulation signal amplified by the first amplifier. This AM modulated signal and the demodulated digital modulated signal are multiplexed and transmitted.

BRIEF DESCRIPTION OF THE DRAWINGS

FIG. 1 a block diagram showing the structure of an AM multiplexing broadcast apparatus according to an embodiment of the invention.

DETAILED DESCRIPTION OF THE PREFERRED EMBODIMENTS

An embodiment of an AM multiplexing broadcast apparatus of this invention will be described. FIG. 1 is a block diagram showing the structure of an AM multiplexing broadcast apparatus according to an embodiment of the invention. In this embodiment, a digital modulated signal is multiplexed by an AM stereophonic transmitter.

In the AM multiplexing broadcast apparatus of the embodiment, a sum signal f(a) of right and left audio signals is input to an audio signal input terminal a, and a difference signal f(a') between the right and left audio signals is input to an audio signal input terminal b. A digital modulated signal f(d) in the same frequency band as an AM modulated signal is input to a digital data input terminal c.

The sum and difference signals are given by:

Sum signal f(a)=L+R

Difference signal f(a')=L−R where L is a left audio signal and R is a right audio signal.

The sum signal f(a) is supplied to and amplified by an amplifier 1 having an amplification factor S(a). The sum signal f(a) is also supplied to an inverse calculator 2 to calculate an inverse of the sum signal f(a). An output of the inverse calculator 2 is supplied to a divider 3 at which the output of the inverse calculator 2 is divided by the amplification factor S(a) of the amplifier 1. An output of the divider 3 and the digital modulated signal f(d) input to the digital data input terminal c are supplied to and multiplied by a multiplier 4, so that the digital modulated signal f(d) is AM modulated by the output of the divider 3.

A carrier generator 5 generates an AM carrier. This AM carrier and the difference signal are supplied to a phase modulator 6 at which the AM carrier is phase-modulated by the difference signal f(a'). An output of the phase modulator 6 is represented by f(pm).

An output of the multiplier 4 and an output of the phase modulator 6 are synthesized or added together and supplied to an amplifier 7 having an amplification factor of C(a) to amplify the synthesized signal. An output of the amplifier 1 and an output of the amplifier 7 are supplied to and multiplied by a multiplier 8 so that an output of the amplifier 7 as a carrier is AM modulated by an output of the amplifier as a modulating signal. The modulated signal is supplied to an antenna 9 and transmitted therefrom.

In operation of the AM multiplexing broadcast apparatus of this embodiment constructed as above, the sum signal f(a) applied to the input terminal (a) is amplifier by the amplifier 1 having the amplification factor S(a) to obtain a signal f(a)·S(a).

An inverse of the sum signal f(a) is obtained by the inverse calculator 2 which outputs 1/f(a). An output of the inverse calculator 2 is divided by S(a) by the divider 3 which outputs 1/{S(a)·f(a)}. The output of the divider 3 and the digital modulated signal f(d) are multiplied by the multiplier 4 so that the output of the divider 3 is AM modulated by the digital modulated signal f(d) and a signal f(d)/{S(a)·(a)} is output from the multiplier 4.

A sum of this signal f(d)/{S(a)·(a)} and an output f(pm) from the phase modulator 6 is amplifier by the amplifier 7 having the amplification factor C(a) to obtain an output signal of [f(d)/{S(a)·f(a)}+f(pm)]·C(a).

The outputs of the amplifiers 7 and 1 are multiplied by the multiplier 8 so that the output of the amplifier 7 is AM modulated by the output of the amplifier 1 to obtain an output signal {S(a)·f(a)·f(pm)+f(d)}·C(a).

Therefore, this output of the multiplier 8 can be considered to be a sum of the AM signal components {S(a)·f(a)·f(pm)} and the digital modulated components f(d) respectively multiplied by C(a). Considering the output of the multiplier 8 of the AM multiplexing broadcast apparatus of this embodiment, the digital modulated signal once AM modulated by the multiplier 4 is AM demodulated thereafter by the multiplier 8 to recover the original digital modulated signal. Therefore, this digital modulated signal amplified by C(a) and multiplexed by the AM modulated signal is transmitted.

In this embodiment of the AM multiplexing broadcast apparatus, a digital modulated signal is multiplexed by an AM stereophonic transmitter. In this case, the sum signal may be a Japanese language audio signal and the difference signal may be a foreign language audio signal.

As described above, according to the AM multiplexing broadcast apparatus of this invention, a digital modulated signal is AM modulated by a first multiplier and then AM demodulated by a second multiplier to recover the original digital modulated signal amplified by C(a). This digital modulated signal is multiplexed by the signal AM modulated by the second multiplier and transmitted from the antenna.

What is claimed is:

1. An AM multiplexing broadcast apparatus for multiplexing a digital modulated signal independent of an AM modulated signal, in the same frequency band as the AM modulated signal, said AM multiplexing broadcast apparatus comprising:

an inverse calculator for calculating an inverse of a modulation signal;

a first multiplier for multiplying a signal associated with an output of said inverse calculator by the digital modulated signal in the same frequency band as the AM modulated signal; and a second multiplier for multiplying a signal obtained by synthesizing an output of said first multiplier with an output of a carrier generator by a signal associated with the modulation signal, wherein an output of said second multiplier is transmitted.

2. An AM multiplexing broadcast apparatus for multiplexing a digital modulated signal independent of an AM modulated signal, in the same frequency band as the AM modulated signal, said AM multiplexing broadcast apparatus comprising:

an amplifier for amplifying a modulation signal;

an inverse calculator for calculating an inverse of the modulation signal;

a divider for dividing an output of said inverse calculator by an amplification factor of said amplifier;

a first multiplier for multiplying an output of said divider by the digital modulated signal in the same frequency band as the AM modulated signal; and a second multiplier for multiplying a signal obtained by synthesizing an output of said first multiplier with an output of a carrier generator by an output of said amplifier, wherein an output of said second multiplier is transmitted.

3. An AM multiplexing broadcast apparatus for multiplexing a digital modulated signal independent of an AM modulated signal, in the same frequency band as the AM modulated signal, said AM multiplexing broadcast apparatus comprising:

a first amplifier for amplifying a modulation signal;

an inverse calculator for calculating an inverse of the modulation signal;

a divider for dividing an output of said inverse calculator by an amplification factor of said first amplifier;

a first multiplier for multiplying an output of said divider by the digital modulated signal in the same frequency band as the AM modulated signal; and a second amplifier for amplifying a signal obtained by synthesizing an output of said first multiplier with an output of a carrier generator; and a second multiplier for multiplying an output of said first amplifier by an output of said second amplifier, wherein an output of said second multiplier is transmitted.

* * * * *